United States Patent
Wang et al.

(10) Patent No.: US 9,386,717 B2
(45) Date of Patent: Jul. 5, 2016

(54) DISPLAY STRUCTURE WITH INDUCTIVE POWER SUPPLY

(71) Applicant: E-Business International, Inc., Beaverton, OR (US)

(72) Inventors: George Wang, Portland, OR (US); Edward Wang-Chang, Portland, OR (US)

(73) Assignee: E-BUSINESS INTERNATIONAL, INC., Beaverton, OR (US)

( * ) Notice: Subject to any disclaimer, the term of this patent is extended or adjusted under 35 U.S.C. 154(b) by 596 days.

(21) Appl. No.: 13/802,216

(22) Filed: Mar. 13, 2013

(65) Prior Publication Data

US 2013/0279091 A1 Oct. 24, 2013

Related U.S. Application Data

(60) Provisional application No. 61/637,799, filed on Apr. 24, 2012.

(51) Int. Cl.
| | |
|---|---|
| *H02J 7/00* | (2006.01) |
| *H05K 7/02* | (2006.01) |
| *H02J 7/02* | (2016.01) |
| *H02J 17/00* | (2006.01) |
| *H05K 13/00* | (2006.01) |
| *H02J 5/00* | (2016.01) |

(52) U.S. Cl.
CPC . *H05K 7/02* (2013.01); *H02J 7/025* (2013.01); *H02J 17/00* (2013.01); *H05K 13/0023* (2013.01); *H02J 5/005* (2013.01); *Y10T 29/49002* (2015.01)

(58) Field of Classification Search
CPC .............. H02J 7/00; H02J 7/025; H02J 5/005; H05K 13/0023; H05K 7/02; Y10T 29/49002
USPC .......................................................... 320/108
See application file for complete search history.

(56) References Cited

U.S. PATENT DOCUMENTS

| | | | | |
|---|---|---|---|---|
| 5,815,735 | A * | 9/1998 | Baker | G06F 1/1601 439/137 |
| 8,536,829 | B2 * | 9/2013 | Chen | H02J 7/0045 320/107 |
| 2009/0166482 | A1 * | 7/2009 | Gan | F16M 11/04 248/122.1 |
| 2013/0342087 | A1 * | 12/2013 | Guran | H05K 5/0017 312/7.2 |

* cited by examiner

*Primary Examiner* — Vuthe Siek
(74) *Attorney, Agent, or Firm* — Schwabe, Williamson & Wyatt, PC

(57) ABSTRACT

Embodiments of the present disclosure are directed towards electronic display support structures having an inductive power supply and associated systems, techniques, and configurations. In one embodiment, an apparatus includes a display support structure configured to structurally support an electronic display, the display support structure including a power output module that is configured to inductively couple with a power supply charging module disposed in a floor, the display support structure being configured to electrically couple the power output module with the electronic display. Other embodiments may be described and/or claimed.

19 Claims, 4 Drawing Sheets

DISPLAY STRUCTURE WITH INDUCTIVE POWER SUPPLY

CROSS REFERENCE TO RELATED APPLICATIONS

The present application claims priority to U.S. Provisional Application No. 61/637,799, filed Apr. 24, 2012, the entire content and disclosure of which is hereby incorporated by reference in its entirety.

TECHNICAL FIELD

Embodiments of the present invention relate to electronic display structures and, in particular, to electronic display support structures having an inductive power supply and associated systems, techniques, and configurations.

BACKGROUND

Current electronic display systems typically rely on conventional wiring to provide power to an electronic display. Venues such as, for example, airports, markets, restaurants, theaters, and the like, may provide an electronic display to provide visitors with information such as, for example, news, advertisements, or entertainment. For example, when the visitors are lined up in a queue control area (e.g., using a queue control ribbon) or waiting in a lobby, a venue may desire to present information on the electronic display to the visitors. However, the conventional wiring may be cumbersome, unsightly, or otherwise prone to environmental factors such as rodents, human handling, or other forces that may readily compromise the wiring. The conventional wiring itself may present an environmental hazard such as, for example, a tripping hazard or electrical hazard. Current electronic display systems may also require significant time and/or cost to install or uninstall. For example, conventional electronic display systems may be installed/uninstalled by routing a plug and cable from the electronic display to a power outlet.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS

In the following detailed description, reference is made to the accompanying figures which form a part hereof wherein like numerals may designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The term "coupled" along with derivatives, may be used. "Coupled" may mean that two or more elements are in direct physical or electrical contact. However, "coupled" may also mean that two or more elements are not in direct contact with each other, but yet still cooperate or interact with each other.

The description may use the phrases "in an embodiment," or "in various embodiments," which may each refer to one or more of the same or different embodiments. Furthermore, the terms "comprising," "including," "having," and the like, as used with respect to embodiments of the present invention, are synonymous.

Figure 1:
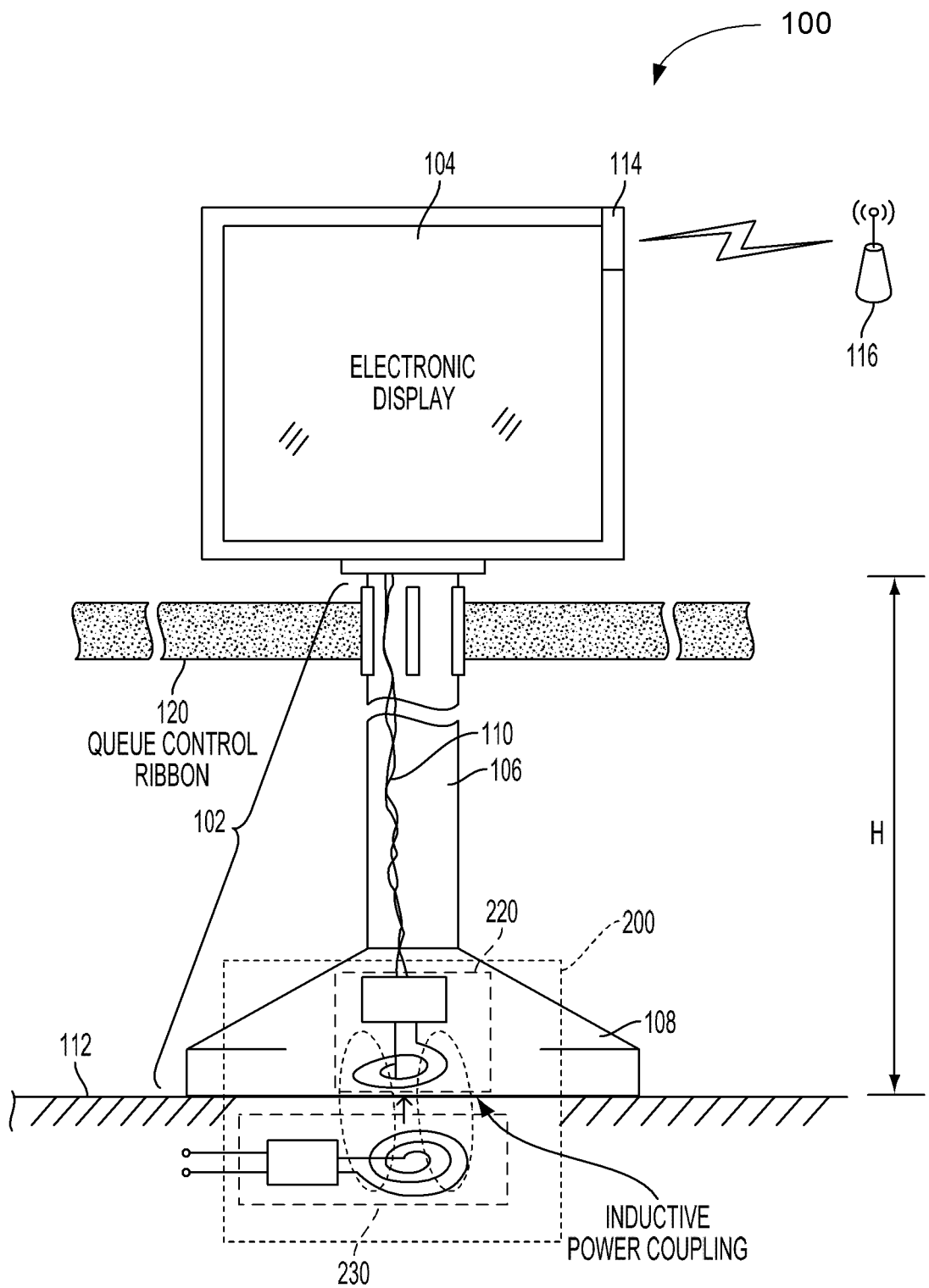
FIG. 1 schematically illustrates a display structure with an inductive power supply, in accordance with various embodiments of the invention.

FIG. 1 is a schematic diagram of a display structure 100 with an inductive power supply (e.g., inductive power supply module 200), in accordance with various embodiments of the invention. The display structure 100 may include a display support structure 102 (e.g., display supporting structure) that is configured to physically or structurally support an electronic display 104. The display support structure 102 may, for example, be configured with a mount to permanently or removably couple the electronic display 104 to the display support structure 102.

The display support structure 102 may be further configured to electrically couple the electronic display 104 with an inductive power supply module 200. For example, the display support structure 102 may include wiring 110 or other means to route power from the inductive power supply module 200 to the electronic display 104 to provide power for the electronic display 104. The wiring 110 may be internal wiring disposed within the display support structure 102. The electronic display 104 may be configured to receive and use the power. The power may be used by the electronic display 104 for a variety of operations including, for example, to display images on a screen, to communicate wirelessly with a wireless network, or to provide power for other electronic functionality of the electronic display 104.

The display support structure 102 may be composed of a single continuous material structure or a plurality of material structures that are configured to structurally couple with one another. In some embodiments, the display support structure 102 may include a post 106 and a base 108 (or analogous structures). The base 108 may provide foundational support for the display support structure 102 on a floor surface 112 (e.g., to prevent tipping). In some embodiments, the base 108 may have a greater width in a direction that is substantially perpendicular to the floor surface 112 than a width of the post 106, as can be seen. The base 108 may be tapered in some embodiments, but can include other shapes and configurations in other embodiments.

In some embodiments, the base 108 may include a power output module 220 of the inductive power supply module 200. The power output module 220 may be coupled with the wiring 110 to provide power to the electronic display 104. The base 108 may be configured to couple with the floor surface 112 to allow the power output module 220 to be charged (e.g., indicated by arrow between power output module 220 and power supply charging module 230) by a power supply charging module 230 (e.g., power supply charging unit) using inductive power coupling. In some embodiments, the power supply charging module 230 may be disposed beneath the floor surface 112. The floor surface 112 may include a mating feature configured to receive a corresponding mating structure of the display support structure 102. For example, the base 108 may be configured to dock into a port in the floor surface 112 to allow the inductive power coupling between the power supply charging module 230 in the floor and the power output module 220 in the base 108. In some embodiments, the floor surface 112 may include markings to guide positioning of the base 108 over the power supply charging module 230 to allow inductive power coupling. In some embodiments, the floor surface 112 may include only markings and no mating features.

In some embodiments, the display support structure 102 may not include a base 108 at all. In such embodiments, the post 106 may include the power output module 220 and may be configured to mate with the power supply charging module 230.

The display support structure 102 may have a length that provides a height, H, relative to the floor surface 112. The height H may be configured for a desired use, according to various embodiments. For example, in embodiments where the display structure 100 is configured for viewing by one or more persons who are standing, the length of the display support structure 102 may be configured to provide a height H ranging from 3 feet to 10 feet. The display support structure 102 may have other lengths that provide other values for height H in other embodiments.

In some embodiments, the display structure 100 may function as a stanchion. For example, the display structure 100 may be coupled with a crowd or queue control barrier such as, for example, a queue control ribbon 120 in some embodiments. The queue control ribbon 120 may serve as a barrier for controlling persons in a queue or crowd (e.g., to direct persons through security clearance at an airport). The queue control ribbon 120 may be configured to physically couple with the display support structure 102 (e.g., the post 106).

In some embodiments, the queue control ribbon 120 may be configured to route electrical signals such as power and/or data to the electronic display 104. For example, the queue control ribbon 120 (or analogous feature) may include embedded wiring (not shown) within an electrically insulative material to route the electrical signals. The embedded wiring of the queue control ribbon 120 may be electrically coupled with the electronic display 104 either directly from the queue control ribbon 120 using an electrical interface (e.g., plug and short cable) or via the display support structure 102. For example, the display support structure 102 may be configured with an electrical interface (e.g., plug or other connector) to receive the electrical signals from the embedded wiring or the embedded wiring may be routed directly into the display support structure 102 from the queue control ribbon 120.

In embodiments where the queue control ribbon 120 is configured to route power, the power may be supplied from the inductive power supply module 200 and routed through the display support structure 102 to the queue control ribbon 120 via an electrical interface and/or wiring. The power may then be routed along the queue control ribbon 120 to one or more other electronic displays (e.g., mounted on stanchions or other display support structures similar to display support structure 102). In embodiments where the queue control ribbon 120 is configured to route other electrical signals (e.g., image information for the electronic display 104), the electrical signals may be routed from a source (e.g., a storage medium having image information) along the queue control ribbon 120 to the electronic display 104 via an electrical interface or wiring.

In some embodiments, the electrical signals including image information for the electronic display 104 may be routed from an electrical interface (not shown) in the floor surface 112 (e.g., adjacent to the inductive power supply module 200). For example, the electrical signals may be routed from the electrical interface through wiring (e.g., similar to wiring 110) that extends along a length of the display support structure 102 and electrically couples with the electronic display 104. In some embodiments, the previously described mating features or markings may be used to coordinate coupling of the electrical interface in the floor surface 112 with a corresponding electrical interface of the display support structure 102.

In some embodiments, the electronic display 104 may be configured with a wireless communication interface 114. The wireless communication interface 114 may be configured to wirelessly transmit and/or receive signals over an air medium. In some embodiments, the wireless communication interface 114 may be configured to access a network via a coordinator 116. The coordinator 116 may include, for example, a base station or access point of a wireless communication network. The coordinator 116 may coordinate connection of the electronic display 104 (e.g., via the wireless communication interface 114) with a Radio Access Network (RAN), which may provide access to a core network and/or the Internet. In some embodiments, the electronic display 104 may be configured to receive image information to display via the wireless communication interface 114 from a source of the image information (e.g., a storage medium of a server of a wireless communication network).

The wireless communication interface 114 may be configured to communicate with a wide variety of wireless networks including, for example, wireless local area networks (WLANs), wireless personal area networks (WPANs) and/or wireless wide area networks (WWANs) such as, for example, cellular networks (e.g., 2G, 3G, 4G, 5G, etc.). The wireless communication interface 114 may be configured to communicate using additional/alternative communication standards, specifications, and/or protocols.

According to various embodiments, the electronic display 104 may be a liquid crystal display (LCD), light-emitting diode (LED) display, or electrophoretic ink (E Ink) display, but is not limited in this regard and may include other suitable displays in other embodiments. The electronic display 104 may be single-sided or double-sided (e.g., have one or two screens).

The display support structure 102 may be composed of any suitable material including, for example, metals, polymers, ceramics, combinations thereof, and the like. In some embodiments, the display structure 100 is configured with power control (not shown) to provide "on"/"off" functionality. For example, the display structure 100 may include a power switch on the electronic display and/or the display support structure 102 to prevent access to power by the electronic display 104 and/or components of the inductive power supply module 200.

Figure 2:
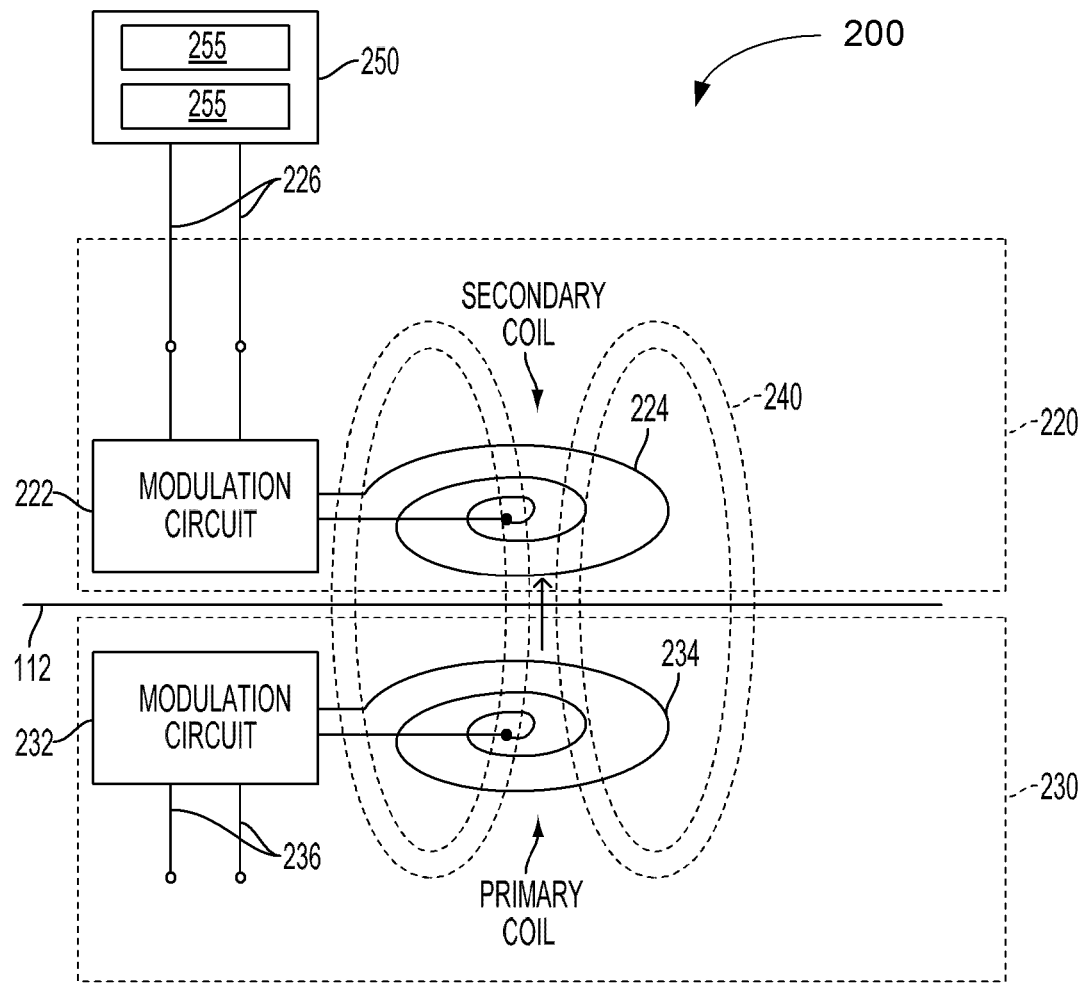
FIG. 2 schematically illustrates an inductive power supply module, in accordance with various embodiments of the invention.

FIG. 2 is a schematic diagram of an inductive power supply module 200, in accordance with various embodiments of the invention. The inductive power supply module 200 may comport with embodiments described in connection with FIG. 1. The inductive power supply module 200 may include power output module 220 and a power supply charging module 230. In some embodiments, the power output module 220 may be disposed in a display support structure (e.g., the display support structure 102 of FIG. 1) and the power supply charging module 230 may be disposed in or beneath a floor surface 112.

The power supply charging module 230 may include a modulation circuit 232 coupled with a power supply (e.g., via electrical couplers 236) and configured to drive a first coil 234 (e.g., primary coil). For example, the modulation circuit 232 may create an electromagnetic field 240 such as an alternating electromagnetic field (e.g., radio frequency (RF) field magnet flux). According to various embodiments, the inductive power supply module 200 may use the electromagnetic field 240 to transfer energy (e.g., "wireless" energy transfer) between the first coil 234 and a second coil 224 (e.g., secondary coil) of the power output module 220. The first coil 234 and the second coil 224 may be mutual-inductively coupled or magnetically coupled and may combine to form a transformer in some embodiments. The energy received at the second coil 224 may be received by a modulation circuit 222 of the power output module 220 that is configured to output the energy as power (e.g., to power the electronic display 104 of FIG. 1).

In some embodiments, the power output by the modulation circuit 222 may be routed (e.g., via electrical couplers 226) to a battery charging module 250 that is configured to charge one or more batteries 255 using the power. The electronic display (e.g., the electronic display 104 of FIG. 1) may be coupled with the one or more batteries 255 to provide power for the electronic display. The battery charging module 250 and/or the batteries 255 may be disposed in the display support structure (e.g., the display support structure 102 of FIG. 1) or the electronic display (e.g., the electronic display 104 of FIG. 1) according to various embodiments.

Figure 3:
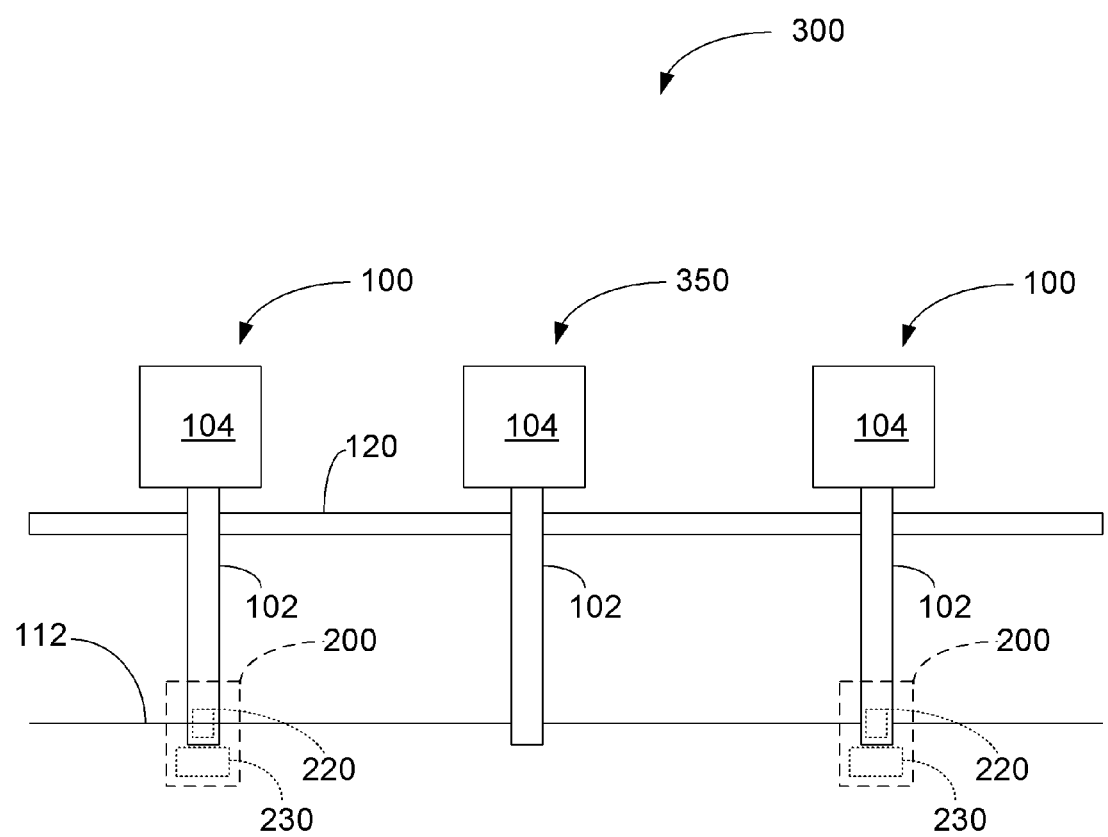
FIG. 3 schematically illustrates an example system including a plurality of display structures as described herein, in accordance with various embodiments of the invention.

FIG. 3 is a schematic diagram of an example system 300 including a plurality of display structures as described herein, in accordance with various embodiments of the invention. The plurality of display structures may include, for example, one or more display structures (hereinafter "display structure(s) 100") that comport with embodiments described in connection with FIG. 1 and one or more display structures (hereinafter "display structure(s) 350") that may not have components of an inductive power supply module 200 as described herein.

The display structure(s) 350 may be configured to electrically couple with the display structure(s) 100 in accordance with embodiments described herein. For example, in some embodiments, the display structure(s) 100 may be configured with an inductive power supply module 200 having a power output module 220 and power supply charging module 230 as described herein. The power provided by the inductive power supply module 200 of the display structure(s) 100 may be routed to provide power to the electronic display 104 of the one or more display structure(s) 350 using techniques described in connection with FIG. 1. For example, power may be routed from the inductive power supply module 200 of the display structure(s) 100 to the electronic display 104 of the one or more display structure(s) 350 using wiring embedded in the queue control ribbon 120. Electrical signals that include image information for display on the electronic display of the display structure(s) 100 and/or 350 may be routed to the display structure(s) 100 and/or 350 using the queue control ribbon 120. In other embodiments, the electronic display 104 of the display structure(s) 100 and/or 350 may be configured to wirelessly receive the information for display over a wireless link with a wireless communication network as described herein.

The system 300 may simultaneously provide queue or crowd control functionality and electrical routing of display information signals and/or power to an electronic display 104. The system 300 may provide techniques and configurations to avoid conventional wiring (e.g., plug and cable to an outlet) to provide power to an electronic display. Venues such as, for example, airports, markets, restaurants, theaters, and the like, may install the display structure(s) 100 and/or 350 to provide persons with information such as, for example, news, advertisements, or entertainment. For example, when persons are lined up in a queue control area (e.g., using queue control ribbon 120) or waiting in a lobby, a venue may desire to present information on the electronic display 104 to the persons. The system 300 may allow the venue to avoid conventional wiring that may be cumbersome, unsightly, or otherwise prone to environmental factors such as rodents, human handling, or other forces that may readily compromise the wiring. For example, the conventional wiring itself may present an environmental hazard such as, for example, a tripping hazard or electrical hazard. The system 300 may be easier to install/uninstall than electronic display systems that rely on conventional wiring. For example, the display structure(s) 100 may be easily removed and replaced without plugging or unplugging any wired interfaces.

Figure 4:
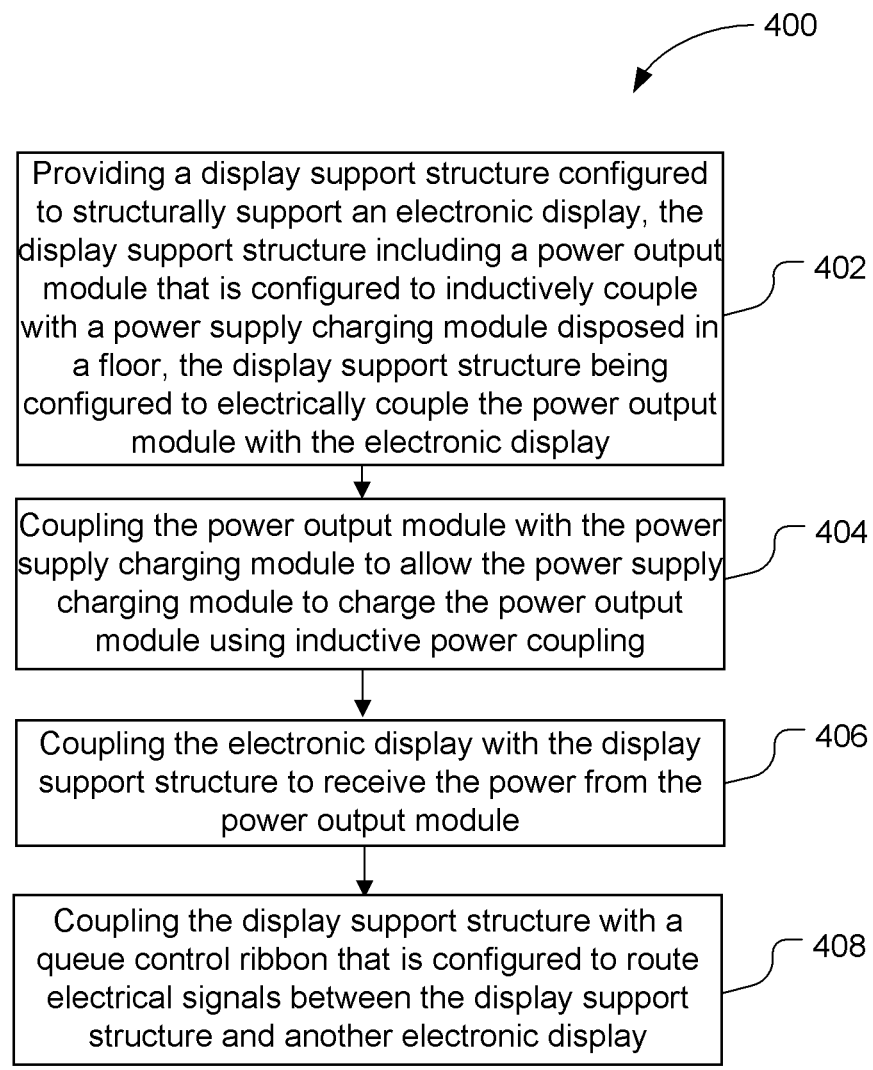
FIG. 4 is a flow diagram of an example method, in accordance with various embodiments of the invention.

FIG. 4 is a flow diagram of an example method 400, in accordance with various embodiments of the invention. The method 400 may comport with various embodiments described in connection with FIGS. 1-3.

At 402, the method 400 may include providing a display support structure configured to structurally support an electronic display, the display support structure including a power output module that is configured to inductively couple with a power supply charging module disposed in a floor, the display support structure being configured to electrically couple the power output module with the electronic display. The display support structure may comport with other embodiments described herein.

At 404, the method 400 may include coupling the power output module with the power supply charging module to allow the power supply charging module to charge the power output module using inductive power coupling. The power output module and the power supply charging module may be coupled using, for example, techniques and configurations described in connection with FIG. 2.

At 406, the method 400 may include coupling the electronic display with the display support structure to receive the power from the power output module. The electronic display may, for example, be configured to permanently or removably couple with a mount of the display support structure. The electronic display may be coupled with the display support structure according to techniques and configurations described elsewhere herein. In some embodiments, the method 400 may include displaying images and/or other information on the electronic display.

At 408, the method 400 may include coupling the display support structure with a queue control ribbon that is configured to route electrical signals between the display support structure and another electronic display. The display support structure may be coupled with the queue control ribbon according to techniques and configurations described elsewhere herein.

Various operations may be described as multiple discrete operations in turn, in a manner that may be helpful in understanding embodiments of the present invention. However, the order of description should not be construed to imply that these operations are order dependent.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
a display support structure configured to structurally support an electronic display, the display support structure including a power output module that is configured to inductively couple with a power supply charging module disposed in a floor, the display support structure being configured to electrically couple the power output module with the electronic display;
wherein:
the power supply charging module includes a first coil and a first modulation circuit coupled with a power supply, the first modulation circuit being configured to create an electromagnetic field in the first coil using the power supply; and
the power output module includes a second coil and a second modulation circuit coupled with the second coil, the second coil being configured to receive energy from the first coil via the electromagnetic field and the second modulation circuit being configured to output the energy as power.

2. The apparatus of claim 1, further comprising:
the electronic display, the electronic display being coupled with a first end of the display support structure, the power output module being disposed at a second end of the display support structure, the first end being disposed opposite to the second end.

3. The apparatus of claim 2, further comprising:
a mount configured to permanently or removably couple the electronic display with the display support structure, wherein the electronic display is configured with a wireless communication interface to wirelessly receive signals including image information over an air medium for display of images on the electronic display.

4. The apparatus of claim 1, wherein the display support structure comprises:
a post member including wiring to electrically couple the electronic display with the power output module; and
a base member coupled with the post member, the base member being configured to provide foundational support for the display support structure on the floor, wherein the power output module is disposed within the base member and is coupled with the wiring to provide power to the electronic display.

5. The apparatus of claim 4, wherein the base member is configured to couple with a surface of the floor to allow the power output module to be charged by the power supply charging module using inductive power coupling.

6. The apparatus of claim 5, wherein the base member includes a mating feature configured to dock into a port in the surface of the floor.

7. The apparatus of claim 1, wherein the display support structure has a height relative to a surface of the floor, the height being configured to allow viewing of the electronic display by one or more persons who are standing on the floor.

8. The apparatus of claim 1, wherein the display support structure is configured to couple with a queue control ribbon that is configured to serve as a barrier for directing or controlling persons in a queue or crowd.

9. The apparatus of claim 8, wherein the queue control ribbon is configured to route power from the power output module to another electronic display.

10. The apparatus of claim 1, further comprising:
a battery charging module coupled with the second modulation circuit and configured to charge one or more batteries using the power output by the second modulation circuit, the one or more batteries being configured to provide power for the electronic display.

11. A method comprising:
providing a display support structure configured to structurally support an electronic display, the display support structure including a power output module that is configured to inductively couple with a power supply charging module disposed in a floor, the display support structure being configured to electrically couple the power output module with the electronic display;
coupling the power output module with the power supply charging module to allow the power supply charging module to charge the power output module using inductive power coupling; and
coupling the display support structure with a queue control ribbon that is configured to serve as a barrier for directing or controlling persons in a queue or crowd and further configured to route power from the power output module to another electronic display.

12. The method of claim 11, further comprising:
coupling the electronic display with a first end of the display support structure, wherein the power output module is disposed at a second end of the display support structure, the first end being disposed opposite to the second end.

13. The method of claim 11, wherein providing a display support structure comprises providing a display support structure having
a post member including wiring to electrically couple the electronic display with the power output module; and
a base member coupled with the post member, the base member being configured to provide foundational support for the display support structure on the floor, wherein the power output module is disposed within the base member and is coupled with the wiring to provide power to the electronic display.

14. A system comprising:
a first display support structure configured to structurally support a first electronic display, the first display support structure including a power output module that is configured to inductively couple with a power supply charging module disposed in a floor, the first display support structure being configured to electrically couple the power output module with the first electronic display;
a second display support structure configured to structurally support a second electronic display; and
a queue control ribbon coupled with the first display support structure and the second display support structure to route electrical signals between the first display support structure and the second display support structure.

15. The system of claim 14, wherein the queue control ribbon is configured to serve as a barrier for directing or controlling persons in a queue or crowd.

16. The system of claim 14, wherein the electrical signals include power output by the power output module for operation of the second display support structure.

17. The system of claim 14, wherein the electrical signals include image information for displaying an image on the first electronic display or the second electronic display.

18. The system of claim 14, wherein the second display support structure does not include a power output module that is configured to inductively couple with a power supply charging module disposed in the floor.

19. An apparatus comprising:
- a display support structure configured to structurally support an electronic display, the display support structure including a power output module that is configured to inductively couple with a power supply charging module disposed in a floor, the display support structure being configured to electrically couple the power output module with the electronic display;
- wherein the display support structure is configured to couple with a queue control ribbon that is configured to serve as a barrier for directing or controlling persons in a queue or crowd, wherein the queue control ribbon is further configured to route power from the power output module to another electronic display.

* * * * *